United States Patent
Aymar et al.

(10) Patent No.: US 7,127,666 B2
(45) Date of Patent: Oct. 24, 2006

(54) DEVICE AND METHOD TO CARRY OUT A VITERBI-ALGORITHM

(75) Inventors: Peter Aymar, Ingersheim (DE); Peter Bohnhoff, München (DE); Ralf Hartmann, München (DE)

(73) Assignee: Infineon Technologies AG, Munich (DE)

( * ) Notice: Subject to any disclaimer, the term of this patent is extended or adjusted under 35 U.S.C. 154(b) by 1051 days.

(21) Appl. No.: 09/864,980

(22) Filed: May 24, 2001

(65) Prior Publication Data

US 2002/0056068 A1 May 9, 2002

(30) Foreign Application Priority Data

May 24, 2000 (EP) .................................. 00111182

(51) Int. Cl.
*H03M 13/03* (2006.01)
*H03D 1/00* (2006.01)

(52) U.S. Cl. ...................... 714/795; 714/794; 714/796; 375/341; 375/262

(58) Field of Classification Search ................ 714/795, 714/794, 796, 786; 375/262, 341, 233, 355
See application file for complete search history.

(56) References Cited

U.S. PATENT DOCUMENTS

| | | | |
|---|---|---|---|
| 5,181,209 A | | 1/1993 | Hagenauer et al. |
| 5,446,746 A | * | 8/1995 | Park ........................... 714/795 |
| 5,802,115 A | * | 9/1998 | Meyer ......................... 375/341 |
| 5,870,433 A | * | 2/1999 | Huber et al. ................. 375/233 |
| 5,881,106 A | * | 3/1999 | Cartier ........................ 375/262 |
| 5,987,490 A | * | 11/1999 | Alidina et al. .............. 708/523 |
| 6,029,968 A | * | 2/2000 | Honegger ..................... 270/37 |
| 6,333,954 B1 | * | 12/2001 | Hansquine ................... 375/341 |
| 6,788,482 B1 | * | 9/2004 | Bliss et al. ................... 360/46 |

FOREIGN PATENT DOCUMENTS

| | | |
|---|---|---|
| EP | 0 944 173 A2 | 9/1999 |
| WO | WO 99/34520 | 7/1999 |

OTHER PUBLICATIONS

Gerhard Bauch et al.: "Iterative Equalization and Decoding in Mobile Communications Systems", XP-002060630, Sep. 30, 1997, pp. 307-312.
G. David Forney, Jr.: "The Viterbi Algorithm", *Proceedings of the IEEE*, vol. 61, No. 3, Mar. 1973, pp. 268-278.
Wolfgang Koch et al.: "Optimum And Sub-Optimum Detection Of Coded Data Disturbed By Time-Varying Intersymbol Interference", *IEEE GLOBECOM*, 1999, pp. 1679-1684.
Biver, et al.: "Architectural Design and Realization of a Single-Chip Viterbi Decoder," 1989, 8220 Integration, the VLSI Journal, Amsterdam, NL, pp. 3-16.

* cited by examiner

*Primary Examiner*—Guy Lamarre
*Assistant Examiner*—Fritz Alphonse
(74) *Attorney, Agent, or Firm*—Laurence A. Greenberg; Werner H. Stemer; Ralph E. Locher

(57) ABSTRACT

An apparatus and method for executing a Viterbi algorithm includes initial state registers, at least one transition register, and an adder/subtracter network. Furthermore, evaluation units and a selection unit are provided for switching the apparatus between a first operating mode and a second operating mode. The selection unit can select different evaluation units depending on the selected operating mode.

28 Claims, 4 Drawing Sheets

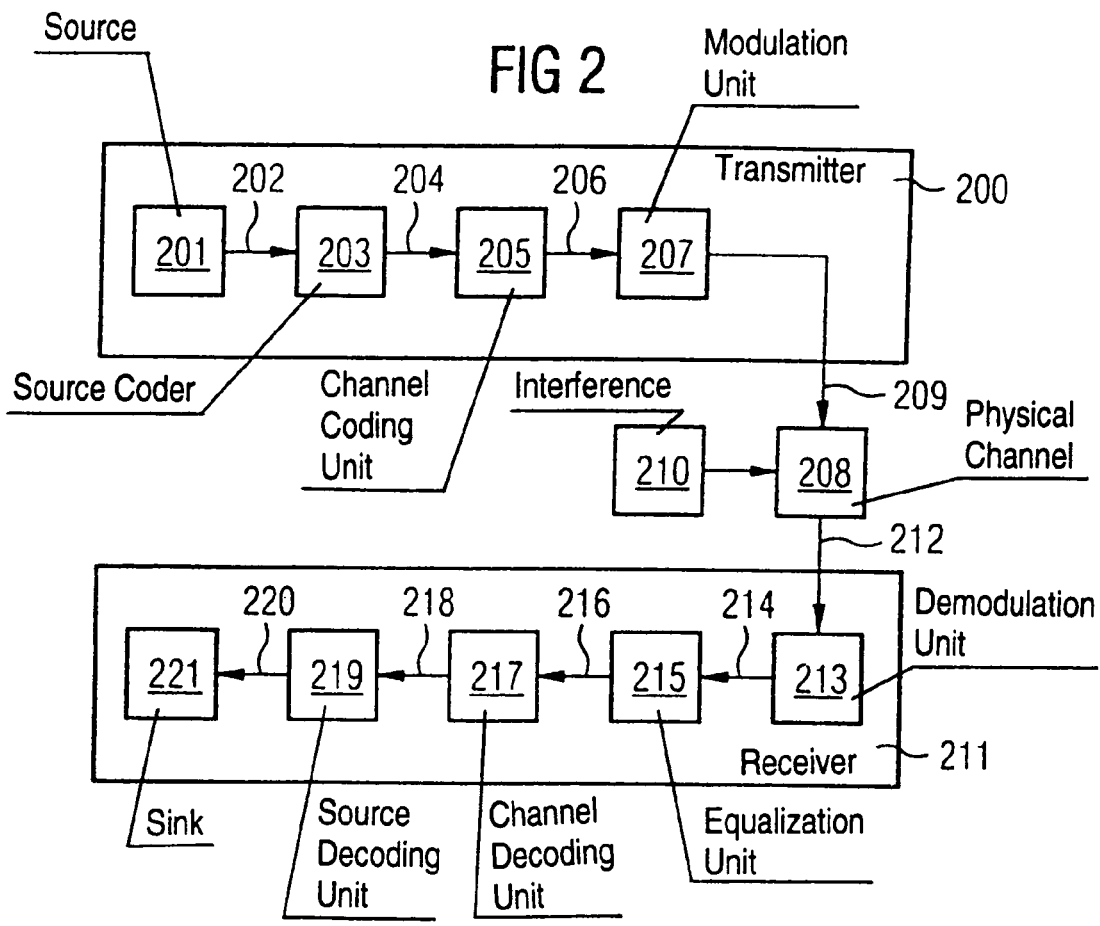

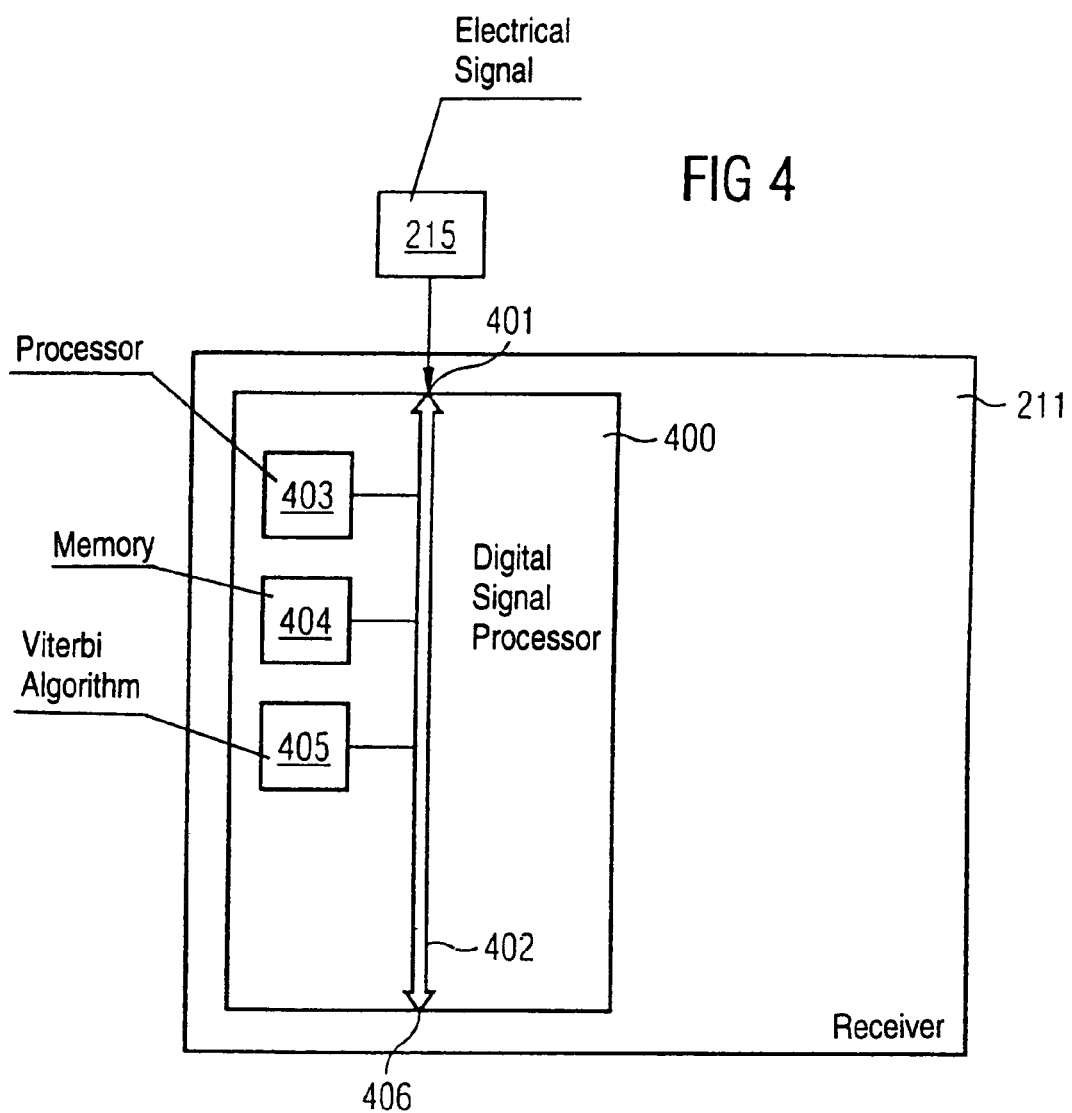

DEVICE AND METHOD TO CARRY OUT A VITERBI-ALGORITHM

BACKGROUND OF THE INVENTION

Field of the Invention

Such an apparatus and such a method are disclosed in WO 99/34520, corresponding to U.S. Pat. No. 6,115,436 to Ramesh et al. (hereinafter "Ramesh").

In the method and apparatus disclosed in Ramesh, a received decoded signal is decoded by an electrical circuit that is disposed in accordance with a so-called butterfly structure. The Ramesh procedure is used exclusively for channel decoding of channel-coded signals.

Using this apparatus, it is not possible to equalize received physical signals by means of the Viterbi algorithm.

This additional option is, however, desirable in order to obtain a simple apparatus which can be used without any problems in a wide range of different applications and is suitable for executing the Viterbi algorithm not only for decoding received signals but also for equalizing received signals.

W. Koch and A. Baier, Optimum and Suboptimum Detection of Coded Data Disturbed by Time-varying Intersymbol Interference, IEEE GLOBECOM, pages 167–1684, 1999 (hereinafter "Koch"), discloses the determination of a so-called transition metric for a Viterbi algorithm in the course of equalization of physical signals for so-called soft decision equalization. Furthermore, Koch discloses the entire Viterbi method, matched to the appropriate transition metrics for a so-called butterfly structure of a trellis, and the determination of the "optimum" signal sequence of the received signals by so-called back-tracing from the optimum trellis determined.

One particular disadvantage of the procedure described in Koch is that the circuit described there is suitable only for equalization of received physical signals. The Koch apparatus cannot be used for channel decoding of physical signals.

The principles of the Viterbi algorithm are described in G. D. Forney, The Viterbi-Algorithm, Proceedings of the IEEE, Vol., 61, No. 3, pages 268–278, 1973 (hereinafter "Forney").

SUMMARY OF THE INVENTION

It is accordingly an object of the invention to provide a device and method to carry out a veterbi algorithm that overcomes the hereinafore-mentioned disadvantages of the heretofore-known devices of this general type and that makes it possible to use a Viterbi algorithm flexibly for different; selectable operating modes, for example, for equalization and for decoding received physical signals.

An apparatus for executing a Viterbi algorithm has a number of initial state registers, in each of which a state metric of an initial state of a trellis can be stored. A transition metric for the trellis can be stored in at least one transition register. Furthermore, an adder/subtracter network is provided, which is connected to the initial state registers, to the transition register and to evaluation units in accordance with a butterfly structure of the trellis. The signals processed by the adder/subtracter network are evaluated in evaluation units using the Viterbi algorithm. Furthermore, a selection is provided, in which the apparatus can be switched to between a first operating mode and a second operating mode. In addition, the apparatus has final state registers, which are coupled to the evaluation units. A state metric for a final state of the trellis can be stored in each final state register. Different evaluation units can be selected using the selection unit, depending on the selected operating mode.

In a first step of a method for executing a Viterbi algorithm, an operating mode is selected from a first operating mode or second operating mode of the apparatus. In this case, the first operating mode may be decoding of received physical signals, and a second operating mode may be a mode in which received physical signals are equalized. In a further step, a state metric of an initial state of a trellis is in each case stored in an initial state register. Furthermore, at least one transition metric of the trellis is stored, depending on the selected operating mode. The state metrics and the transition metric are linked to one another in accordance with a butterfly structure of the trellis using the Viterbi algorithm and depending on the selected operating mode. The linked variables are selected depending on the selected operating mode, and the selected linked variables are stored as a state metric of a respective final state of the trellis. The method is carried out iteratively until the Viterbi algorithm has been completed.

The invention for the first time makes it possible to use a Viterbi algorithm for different fields of operation, for example for channel decoding of physical signals or for equalization of physical signals.

Preferred developments of the invention can be found in the dependent claims.

The developments of the invention relate not only to the method but also to the apparatus for executing the Viterbi algorithm.

At least one of the initial state registers in the apparatus may also have a buffer register.

In this way, according to one preferred refinement of the invention, it is possible to store the respective state metric (which is stored in the initial state register) of the initial state of the trellis in a respective buffer register as soon as a final state has been read from the final state register. In this situation, a new state metric of an initial state of a trellis is preferably stored in a respective initial state register as soon as the respective initial state of the trellis has been stored in the buffer register.

Furthermore, according to a further refinement of the invention, at least one transition register is provided for storing a transition metric when the apparatus is switched to the first operating mode, and/or for storing a change transition metric when the apparatus is switched to the second operating mode.

This refinement results in further optimization of the speed with which the Viterbi algorithm can be executed since there is no longer any need to store a complete transition metric in a transition register in the course of the second operating mode, and the transition register is used in the course of the other operating mode for storing the transition metric for decoding the physical signals using the Viterbi algorithm.

Thus, only one register is provided for storing different types of transition metrics, depending on the respectively selected operating mode, which leads to a reduction in the chip surface area required to produce the apparatus as an integrated circuit in a chip.

Furthermore, the development results in a saving in the number of memory steps required and steps for storing data in different places, which leads to further optimization of the Viterbi algorithm.

A further refinement of the invention provides for at least two transition registers to be provided for storing two different transition metrics when the apparatus is switched to the second operating mode. In particular, three transition registers are preferably provided for storing different transition metrics for the second operating mode of the apparatus, with the respective transition metrics of the butterfly structure of the previous state being stored in two transition registers, and a change transition metric from the previous state to the state to be calculated at that time being stored in the third transition register.

In a further preferred refinement of the invention, at least some of the provided registers in the apparatus are coupled to a processor by means of a signal bus.

Particularly when using a digital signal processor, this development results in its processor being relieved of the load for trellis calculation for the Viterbi algorithm, thus making it possible for the digital signal processor to take on other tasks.

The processor preferably controls the storage and reading of the individual initial state registers and of the final state registers. It also preferably calculates the required transition metrics and the change transition metrics, as well as controlling the so-called back-tracing for determining the optimum data reception sequence, from the stochastic point of view, which should be determined from the received physical signals.

Furthermore, a memory, for example a random access memory (RAM), which is coupled to the registers via the signal bus can be provided in the apparatus. The required metrics and the initial states and final states of the respective trellis are preferably stored in the memory in accordance with the Viterbi algorithm.

In one preferred embodiment of the invention, at least one adder and/or at least one subtracter, and preferably three adders and three subtracters, are provided in the adder/subtracter network and are coupled to one another in the following manner:

a first input of a first adder being coupled to the output of a first transition register, a second input of the first adder being coupled to the output of a second transition register, a first input of a first subtracter being coupled to the output of the second transition register, a second input of the first subtracter being coupled to the output of a third transition register, a first input of a second adder being coupled to the output of the first buffer register, a second input of the second adder being coupled to the output of the first adder, a first input of a second subtracter being coupled to the output of the first buffer register, a second input of the second subtracter being coupled to the output of the first adder, a first input of a third adder being coupled to the output of the first subtracter, a second input of the third adder being coupled to the output of a second buffer register, a first input of a third subtracter being coupled to the output of the first subtracter, and a second input of the third subtracter being coupled to the output of the second buffer register.

The evaluation units may have a trace-back register and/or comparison units and/or maximum selection elements.

A control input of a trace-back register can be coupled to a control input of a first final state register in such a manner that the trace-back register can store new values when a value is read from the first final state register. A first data input of the trace-back register can be coupled to the output of a first comparator, and a second data input of the trace-back register can be coupled to the output of a second comparator.

Furthermore, a first input of a first comparator can be coupled to the output of the second adder, and a second input of the first comparator can be coupled to the output of the third subtracter. A first input of a second comparator can be coupled to the output of the second subtracter, and a second input of the second comparator can be coupled to the output of the third adder.

A further refinement of the invention provides that:

a control input of first maximum selection element is coupled to the control output of the first final state register in such a manner that, when a value is read from the first final state register, the maximum selection element can select a new value, a first input of the first maximum selection element is coupled to the output of the second adder, a second input of the first maximum selection element is coupled to the output of the second subtracter, a control input of a second maximum selection element is coupled to a control output of the second final state register in such a manner that, when a value is read from the second final state register, the maximum selection element can select a new value, a first input of the second maximum selection element is coupled to the output of the third subtracter, and a second input of the second maximum selection element is coupled to the output of the third adder.

The selection unit preferably has maximum selection units and at least one multiplexer.

A further refinement of the invention provides that:

the input of the selection register is coupled to the DSP bus, the output of the selection register is coupled to a control input of a first multiplexer, a first data input of the first multiplexer is coupled to a first data output of the trace-back register, a second data input of the first multiplexer is coupled to the output of the first maximum selection element, a control input of a second multiplexer is coupled to a second data output of the trace-back register, a first data input of the second multiplexer is coupled to the output of the second adder, a second data input of the second multiplexer is coupled to the output of the third subtracter, a control input of a third multiplexer is coupled to a third data output of the trace-back register, a first data input of the third multiplexer is coupled to the output of the second subtracter, and a second data input of the third multiplexer is coupled to the output of the third adder.

The first operating mode is preferably a mode in which the decoding of received, noisy physical signals is carried out using the Viterbi algorithm. The second operating mode may be a mode in which received, noisy physical signals are equalized using the Viterbi algorithm.

The structure described above provides a highly optimized apparatus for executing a Viterbi algorithm, for example for decoding or for equalizing received, noisy physical signals, which requires very few computation steps and memory steps for the high level of complexity of the Viterbi algorithm.

BRIEF DESCRIPTION OF THE DRAWINGS

FIG. 2 is a block circuit diagram illustrating the sending, transmission, and reception of an electrical signal;

FIG. 4 is a block circuit diagram of an exemplary embodiment of a digital signal processor according to the invention.

DESCRIPTION OF THE PREFERRED EMBODIMENTS

Figure 1:
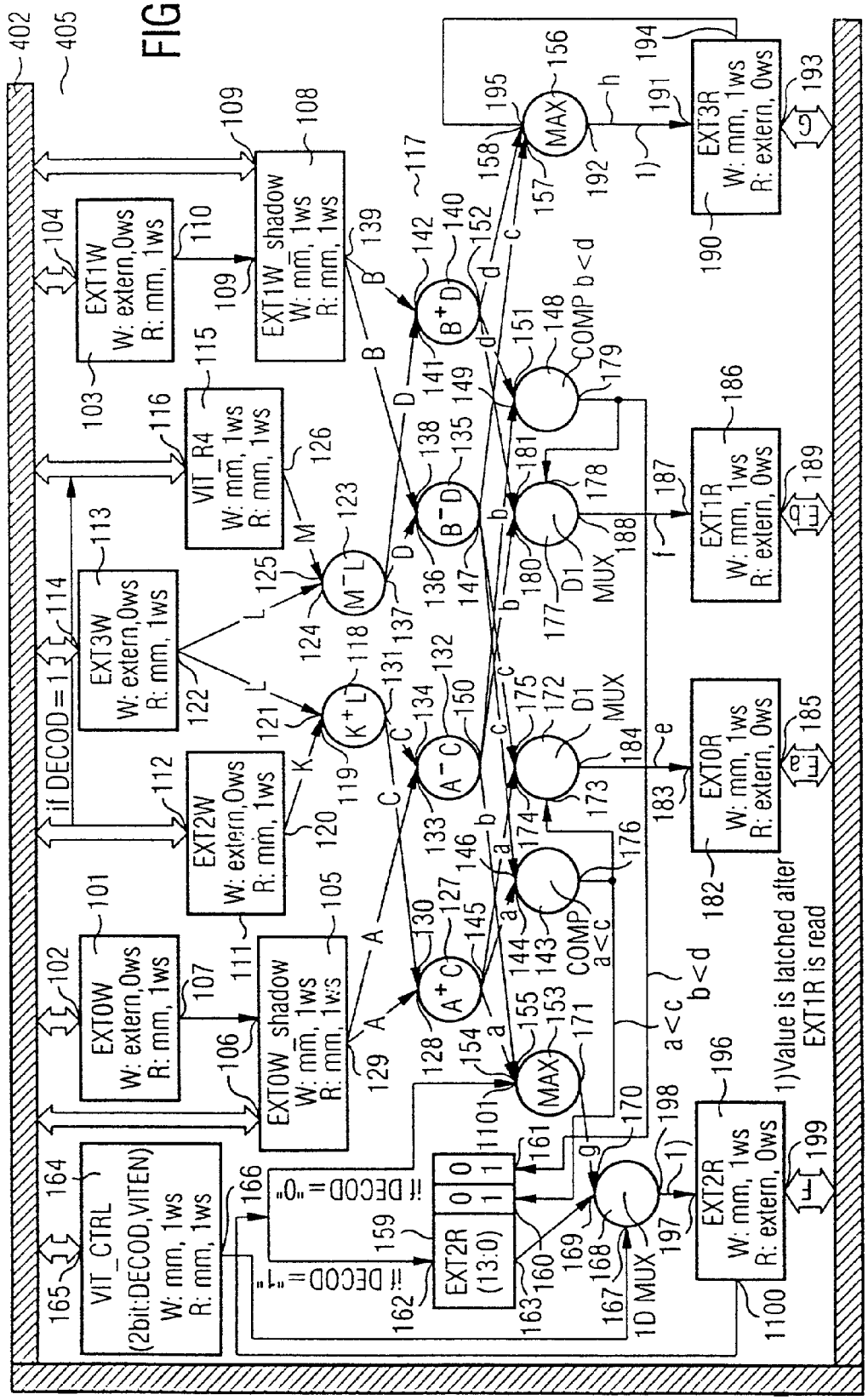
FIG. 1 is a block circuit diagram of an exemplary embodiment of an electrical circuit according to the invention.

Referring now to the figures of the drawings in detail and first, particularly to FIG. 2 thereof, there is shown, symbolically, a source 201, from which a message 202 is intended to be transmitted from a transmitter 200 to a sink 221 in a receiver 211.

The message 202 to be transmitted is applied to a source coder 203, where it is compressed in such a manner that, although no information is lost, redundant information which is superfluous to the decoding of the message 202 is eliminated, and the required transmission capacity is thus reduced.

The output from the source coder 202 is a code word 204

$$\underline{u} \in \{\pm 1\}^k, \quad (1)$$

which comprises a sequence of digital values. In this case, it is assumed for each code word 204 $\underline{u}$ that each value $u_i$, i=1, ..., k, of the code word 204 $\underline{u}$ has the same probability of assuming a first binary value (logic "0") and a second binary value (logic "1").

The code word 204 $\underline{u}$ is supplied to a unit for channel coding 205, in which channel coding of the code word 204 $\underline{u}$ is carried out. During the channel coding process, redundant information is deliberately added to the code word 204 $\underline{u}$ in order to make it possible to correct, or at least to identify, transmission errors which may occur during transmission, thus achieving high transmission reliability.

In the following text, it is assumed that the channel coding process results in each code word 204

$$\underline{u} \in \{\pm 1\}^k$$

being associated with a channel code word 206

$$\underline{c} \in \{\pm 1\}^n, \, n > k, \, n \in N \quad (2)$$

The output from the unit for channel coding 205 thus consists of the channel code word $\underline{c}$ 206.

The channel code word $\underline{c}$ 206 is supplied to a unit for modulation 207 of the channel code word $\underline{c}$ 206. During the modulation process, the channel code word $\underline{c}$ 206 is allocated a function $$s: \Re \to \Re \quad (3)$$

which is suitable for transmission via a physical channel 208.

The modulated signal 209 to be transmitted thus contains both signal information, that is to say the channel code word $\underline{c}$ 206, and redundant information determined from the signal information, that is to say, in addition, the so-called check values, which are also referred to as tail bits.

The modulated signal s 209 is transmitted via the physical channel 208 to a receiver 211. During transmission via the physical channel 208, interference 210 frequently occurs, and this corrupts the modulated signal 209 s.

A modified modulated signal 212

$$\bar{s}: \Re \to \Re \quad (4)$$

thus arrives at the receiver 211, and is supplied to a unit for demodulation 213 in the receiver 211.

The modified modulated signal $\bar{s}$ 212 is demodulated in the unit for demodulation 213. The output from the unit for demodulation 213 is a vector which is referred to in the following text as an electrical signal 214, $$\underline{y} \in \Re^n, \quad (5)$$

and which describes the digital, demodulated, modified signal.

The electrical signal $\underline{y}$ 214 is supplied to a unit for equalization of the electrical signal $\underline{y}$ 214, where it is subjected to a Viterbi algorithm, which is described in the following text, for equalization of the electrical signal $\underline{y}$ 214. Vector components $y_i$ of the electrical signal $\underline{y}$ 214 contain both mathematical sign information and magnitude information.

The magnitude information is in each case the absolute magnitude of the vector component $y_i$, which is also referred to as reliability information for the corresponding mathematical sign of the vector component $y_i$. In the course of equalization of the electrical signal $\underline{y}$ 214 the task which is referred to as soft decision equalization of the electrical signal is carried out.

The equalized electrical signal 216 formed by the unit for equalization 215 of the electrical signal 214 is supplied to a unit for channel decoding 217.

The task which is referred to as soft decision decoding has to be carried out during the channel decoding process. This means that a reconstructed code word is reconstructed and, furthermore, reliability information is determined for each component, describing the decision made relating to reconstruction of a component of the reconstructed code word.

A component of the reconstructed code word 218 is referred to as a digital signal value, in the following text.

The channel decoding is likewise carried out by means of the Viterbi algorithm, but using different transition metrics than in the Viterbi algorithm for equalization of the electrical signal.

The reconstructed code word 218, that is to say at least one digital signal value, is supplied to a unit for source decoding 219, in which source decoding is carried out. Finally, the decoded signal 220 is supplied to the sink 221.

To simplify understanding of the invention, the rough structure of the Viterbi algorithm will be explained in the following text (see FIG. 3A and FIG. 3B). Details of the Viterbi algorithm are described in Fourny.

Figure 3A:
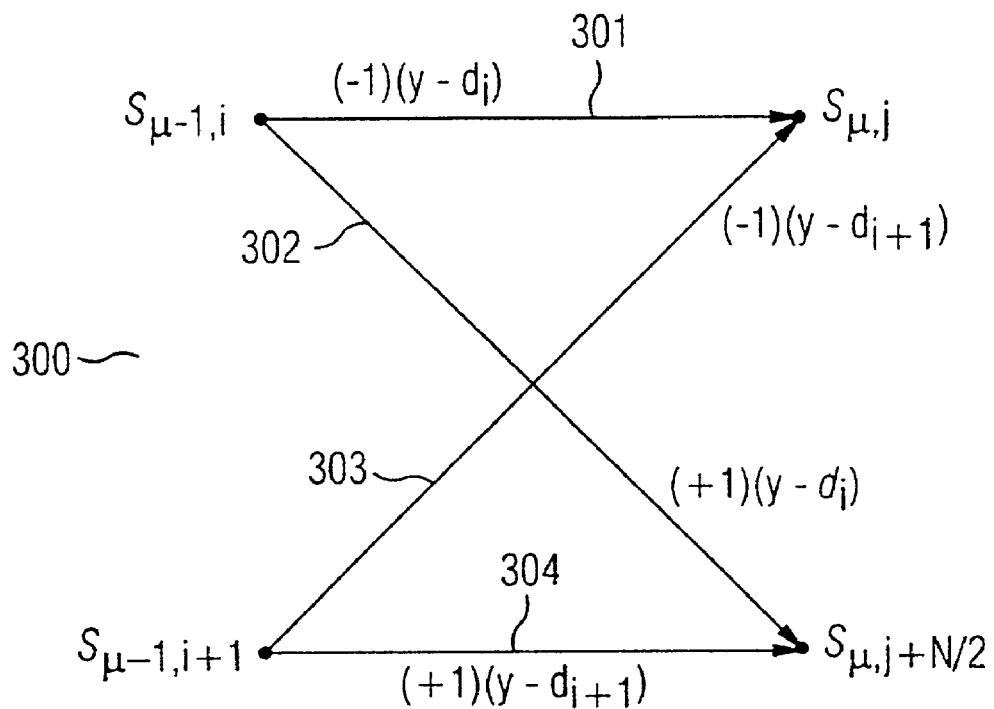
FIG. 3A is a diagram illustrating a binary trellis according to a butterfly structure for equalization of an electrical signal.
Figure 3B:
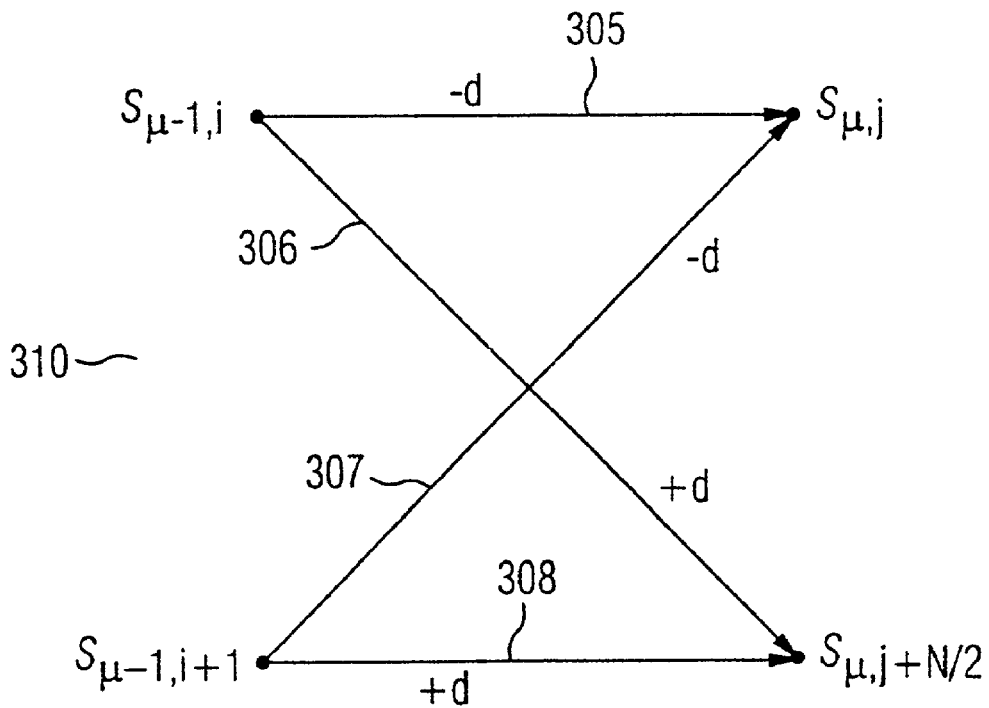
FIGS. 3B is a diagram illustrating a binary trellis according to a butterfly structure for decoding an electrical signal.

For the purposes of this exemplary embodiment, a binary-modulated signal is assumed, that is to say a trellis is offered for execution of the Viterbi algorithm, which can be implemented by means of a butterfly structure 300, as is illustrated in FIG. 3a and FIG. 3b.

According to the trellis for initial states $$s_{\mu-1,i}, \quad (6)$$

$$s_{\mu-1,i+1}, \quad (7)$$

are determined, where

μ denotes a time unit, i=1, ..., N denotes an index for the initial states of the trellis, j=1, ..., N denotes an index for the final states of the trellis, and N denotes the total number of states in the trellis, that is to say the total number of received electrical signals.

The initial states, to each of which a state metric is allocated, are changed by means of multiplication by a transition metric to a final state $$s_{\mu,j}, \quad (8)$$

$$s_{\mu,j+\frac{N}{2}}. \quad (9)$$

The state transitions are denoted by arrows 301, 302, 303, 304, (see FIG. 3*a*), 305, 306, 307, 308 (see FIG. 3*b*) in FIG. 3*a* and FIG. 3*b*.

If the Viterbi algorithm is used for equalization of the electrical signal, then, in detail, this gives the following result, as shown in [2], for the transition metric $I_\mu$:

$$I_\mu = Re\left\{\hat{a}_\mu^*\left[y_\mu - \sum_{l=1}^{L}\hat{a}_{\mu-l}\rho_l\right]\right\} \quad (10)$$

where $$\hat{a}_\mu \in \{+1,-1\} \quad (11)$$

as the estimated transition symbol, $$\hat{a}_{\mu-l} \quad (12)$$

as the state symbol and

μ as the time unit.

The autocorrelation function $\rho_l$:

$$\rho_l = \sum_{i=0}^{L-1} h_i^* h_{i+1} \quad (13)$$

relates to the impulse response $h_0, \ldots, h_L$.

$$y_\mu = \sum_{l=0}^{L} e_{\mu+l} h_l^* \quad (14)$$

is the output signal for the so-called matched filter relating to h(t), where $$e_\mu = \sum_{l=0}^{L} a_{\mu-l} h_l \quad (15)$$

is equal to the received signal.

The term $$d_i = \sum_{l=1}^{L} \hat{a}_{\mu-l}\rho_l \quad (16)$$

in the transition metric is, as described in the following text, calculated in advance and is stored as a reference metric in the memory, preferably an RAM (Random Access Memory).

The following special feature of a binary symbol alphabet can be utilized, in that $$d_{i+2}-d_i=d_{i+3}-d_{i+1} \quad (17)$$

for $$a_\mu \in \{+1,-1\}. \quad (18)$$

There is thus no need to calculate a complete branch metric in accordance with the rule (10) once again for each butterfly, and it is sufficient to add the corresponding difference of the reference metrics to the transition metric, once it has been calculated. The differences in the reference metric are calculated in advance, and are stored in a memory.

In detail, the following transition metric is obtained for the individual initial states relating to the corresponding final states of a butterfly in one iteration, that is to say for one time step.

A first initial state $s_{\mu-1,i}$ is changed by adding $$(-1)\cdot(y-d_i) \quad (19)$$

to a first final state $s_{\mu,j}$.

The first initial state $s_{\mu-1,i}$ is changed by adding $$(+1)\cdot(y-d_i) \quad (20)$$

to a second final state $$s_{\mu,j+\frac{N}{2}}.$$

Furthermore, a second initial state $s_{\mu-1,i+1}$ is changed by adding $$(-1)\cdot(y-d_{i+1}) \quad (21)$$

to the first final state $s_{\mu,j}$.

The second initial state $s_{\mu-1,i+1}$ is furthermore changed by adding $$(+1)\cdot(y-d_{i+1}) \quad (22)$$

to the second final state $$s_{\mu,j+\frac{N}{2}}.$$

The overall Viterbi algorithm is executed in such a manner that the trellis is executed in a known manner for all the considered initial states and final states and for all the time steps, that is to say for the entire length of the electrical signal.

The decoding is carried out in a similar manner, but with different transition metrics, so that, in the operating mode for decoding, the first initial state $s_{\mu-1,i}$ is changed by subtraction of the transition metric d to the first final state $s_{\mu,j}$.

Furthermore, the first initial state sμ−1,i is changed by addition of the transition metric d to the second final state $$s_{\mu,j+\frac{N}{2}}.$$

The second initial state $s_{\mu-1,i+1}$ is changed by subtraction of the transition metric to the first final state $s_{\mu,j}$.

The second initial state $s_{\mu-1,i+1}$ is changed by adding the transition metric to the second final state $S_{\mu, j+\frac{N}{2}}$.

For each iteration, once the final state has been determined, that is to say the state metric of the respective final state for the two respectively determined values, the maximum value is determined and selected.

The corresponding selection decision is normally stored in binary form.

Once a "forward run" has been carried out through the trellis using the stored selection decisions, the statistically optimum symbol sequence is determined by means of so-called back tracing.

As is shown in FIG. 4, the receiver 211 has a digital signal processor 400 for equalization and for channel decoding of the electrical signal 215.

The electrical signal 215 is supplied to an input 401 of the digital signal processor 400. The input 401 is coupled to a signal bus 402 (DSP bus) of the digital signal processor 400.

Furthermore, together with the signal bus 402, a processor 403, a memory 404 and an apparatus, which will be described in the following text, for execution of the Viterbi algorithm 405 (implemented as an electrical circuit) are provided.

In the course of executing the Viterbi algorithm, the required state metrics are supplied from the processor 403 to the appropriate initial state registers, which will be described in the following text, and to the apparatus for the Viterbi algorithm 405 and/or are read from the final state registers, that is to say the individual iterations for the corresponding butterflies are controlled by the processor 403, during the course of executing the Viterbi algorithm.

The transition metrics and a change transition metric which will be described in the following text are determined by the processor 403, and are likewise stored in the memory 404, which is in the form of RAM.

The registers described in the following text are each connected by an input or output to the signal bus 402, so that the processor 403 can access the corresponding required registers depending on the Viterbi algorithm to be executed.

The output signal from the digital signal processor 400, which is produced at its output 406, is either the equalized electrical signal or the channel-decoded electrical signal, that is to say the reconstructed code word 218, depending on the selected operating mode, that is to say depending on whether the Viterbi algorithm is intended to be used for channel decoding or for equalization.

The two different operating modes and their selection will be explained in more detail, with reference to FIG. 1, based on the exemplary embodiment of the invention for the Viterbi algorithm.

The apparatus for executing the Viterbi algorithm, in particular for implementation of a butterfly structure by means of an electrical circuit, has the following components:

A first initial state register 101, whose input 102 is coupled to the signal bus 402.

A second initial state register 103, whose input 104 is coupled to the signal bus 402.

A first buffer register 105, whose input 106 is coupled both to the output 107 of the first initial state register 101 and to the signal bus 402.

A second buffer register 108, whose input 109 is coupled both to the output 110 of the second initial state register 104 and to the signal bus 402.

A first transition register 111, whose input 112 is coupled to the signal bus 402.

A second transition register 113, whose input 114 is coupled to the signal bus 402.

A third transition register 115, whose input 116 is coupled to the signal bus 402.

An adder/subtracter network 117 has the following components:

a first adder 118, whose first input 119 is coupled to the output 120 of the first transition register 111 and whose second input 121 is coupled to the output 122 of the second transition register 113; the first adder 118 forms the sum of the value K in the first transition register 111 and of the value L in the second transition register 113;

a first subtracter 123, whose first input 124 is coupled to the output 122 of the second transition register 113, and whose second input 125 is coupled to the output 126 of the third transition register 115; the first subtracter 123 forms the difference between the value M in the third transition register 115 and the value L in the second transition register 113;

a second adder 127, whose first input 128 is coupled to the output 129 of the first buffer register 105, and whose second input 130 is coupled to the output 131 of the first adder 118; the second adder 127 forms the sum of the value A in the first buffer register 105 and of the sum C formed by the first adder 118;

a second subtracter 132, whose first input 133 is coupled to the output 129 of the first buffer register 105, and whose second input 134 is coupled to the output 131 of the first adder 118; the second subtracter 132 forms the difference between the value A in the first buffer register 105 and the sum C formed by the first adder 118;

a third subtracter 135, whose first input 136 is coupled to the output 137 of the first subtracter 123, and whose second input 138 is coupled to the output 139 of the second buffer register 108; the third subtracter 135 forms the difference between the value B in the second buffer register 105 and the difference D formed by the first subtracter 123;

a third adder 140, whose first input 141 is coupled to the output 137 of the first subtracter 123, and whose second input 142 is coupled to the output 139 of the second buffer register 108; the third adder 140 forms the sum of the difference D formed by the first subtracter 123 and the value B in the second buffer register 108.

In addition, a first comparison unit (comparator) 143 is provided, whose first input 144 is coupled to the output 145 of the second adder 127, and whose second input 146 is coupled to the output 147 of the third subtracter 135. The first comparison unit 143 determines whether the sum a formed by the second adder 127 is less than the difference c formed by the second subtracter 135. If this is the case, then the first comparison unit 143 produces a first comparison signal at a first binary value (logic "1"), otherwise at a second binary value (logic "0").

Furthermore, a second comparison unit 148 is provided, whose first input 149 is coupled to the output 150 of the second subtracter 132, and whose second input 151 is coupled to the output 152 of the third adder 140. The second comparison unit 148 determines whether the difference b formed by the second subtracter 132 is less than the sum d formed by the third adder 140. If this is the case, then the second comparison unit 148 produces a second comparison signal with a first binary value (logic "1"), otherwise with a second binary value (logic "0").

Furthermore, a first maximum selection unit 153 is provided, whose first data input 154 is coupled to the output 145 of the second adder 127, and whose second data input 155 is coupled to the output 150 of the second subtracter 132. When activated via its control input, the first maximum selection unit 153 selects the large value of the sum a formed by the second adder 127 and of the difference b formed by the second subtracter 132, and outputs this larger value as the first maximum output signal g.

A first data input 157 of a second maximum selection unit 156 is coupled to the output 147 of the third subtracter 135, and a second data input 158 of the second maximum selection unit 156 is coupled to the output 152 of the third adder 140. When activated via its control input, the second maximum selection unit 156 selects the larger value of the difference c formed by the third subtracter 135 and of the sum d formed by the third adder 140, and outputs this larger value as the second maximum output signal h.

Furthermore, a trace-back register 159 is provided, having a first data input 160, a second data input 161, a control input 162 and a data output 163.

In addition, a selection register 164 is provided, whose input 165 is coupled to the signal bus 402. The output 166 of the selection register 164 is coupled to a control input 167 of a first multiplexer 168.

A first input 169 of the first multiplexer 168 is coupled to the data output 163 of the trace-back register 159, and a second input 170 of the first multiplexer 168 is coupled to the output 171 of the first maximum selection unit 153.

Depending on the content of the selection register 164, the first multiplexer 168 selects either the contents of the trace-back register 159 (if the "decode" operating mode has been selected by means of the selection register 164) or the first maximum output signal g (if the "equalize" operating mode has been selected by means of the selection register 164).

Furthermore, a second multiplexer 172 is provided, whose control input 173 is coupled to the first data input 160 of the trace-back register 159, while its first data input 174 is coupled to the output 145 of the second adder 127 and its second data input 175 is coupled to the output 147 of the third subtracter 135.

The control input 173 of the second multiplexer 172 is, furthermore, coupled to the output 176 of the first comparison unit 143.

Thus, according to this exemplary embodiment, the first comparison signal, which is stored in the trace-back register 159, is used as a control signal for the second multiplexer 172 in such a manner that, in the situation where the sum a formed by the second adder 127 is less than the difference c formed by the second subtracter 135, the difference c which is applied to the second input 175 of the second multiplexer 172 is selected. If the sum a which is formed by the second adder 127 and is applied to the first input 174 of the second multiplexer 172 is greater than the difference c formed by the second subtracter 135, then the sum a is selected as the first final state signal e.

In addition, a third multiplexer 177 is provided, whose control input 178 is coupled to the output 179 of the second comparison unit 148.

The output 179 of the second comparison unit 148 is, furthermore, coupled to the second data input 161 of the trace-back register 159.

A first input 180 of the third multiplexer 177 is coupled to the output 150 of the second subtracter 132, and a second input 181 of the third multiplexer 177 is coupled to the output 152 of the third adder 140.

Thus, according to this exemplary embodiment, the second comparison signal, which is stored in the trace-back register 159, is used as a control signal for the third multiplexer 177, in such a manner that, in the situation where the difference b formed by the second subtracter 132 is less than the sum d formed by the third adder 140, the sum d which is applied to the second input 181 of the third multiplexer 177 is selected. If the difference b which is formed by the second subtracter 132 and is applied to the first input 180 of the third multiplexer 177 is greater than the sum d formed by the third adder 140, then the difference b is selected as the second final state signal f.

Furthermore, a first output state register 182 is provided, whose input 183 is coupled to the output 184 of the second multiplexer 172. The output 185 of the first output state register 183 is coupled to the signal bus 402. The first final state signal e is stored in the first output state register 182.

In addition, a second output state register 186 is provided, whose input 187 is coupled to the output 188 of the third multiplexer 177, and whose output 189 is coupled to the signal bus 402. The second final state signal f is stored in the second output state register 186.

A third output state register 190 is coupled via its input 191 to the output 192 of the second maximum selection unit 156, and its output 193 is coupled to the signal bus 402. The second maximum output signal h is stored in the third output state register 190. In addition, a controlling output 194 of the third output state register 190 is coupled to a control input 195 of the second maximum selection unit 156.

The input 197 of a fourth output state register 196 is coupled to the output 198 of the first multiplexer 170.

The output 199 of the fourth output state register 196 is coupled to the signal bus 402. A control output 1100 of the fourth output state register 196 is coupled to the control input of the trace-back register 162 and to a control input 1101 of the first maximum selection unit 153.

The execution of the Viterbi algorithm for equalization of an electrical signal will be explained in more detail in the following text.

In a first step, the electrical circuit 405 is initialized, and the first so-called butterfly is executed for the trellis in accordance with the Viterbi algorithm.

First of all in this context, the state metric of the first initial state $s_{\mu-1,i}$ for the first time unit μ−1 is loaded into the first initial state register 101.

The state metric of the second initial state $s_{\mu-1,i+1}$ for the first time unit μ−1 is loaded into the second initial state register 103.

In a further step, the third initial state register 192 and the fourth output state register 198 are initialized with the largest negative number which can be loaded by the respective register (maximum search for the best zero path and for the best so-called one's path, as described in [2]).

Furthermore, the second transition register 113 is initialized with the value 0.

The value $d_0-y$ is loaded into the first transition register 111, and the value $y-d_1$ is loaded into the third transition register 115.

In a further step, the value in the second output state register 186 is read, by which means the values from the first initial state register 101 and from the second initial state register 103 are transferred to the corresponding buffer registers, that is to say to the first buffer register 105 and to the second buffer register 108.

Furthermore, the values which are present in the first output state register 182, in the fourth output state register 196 and in the third output state register 190 are read via the signal bus 402.

The loading of the buffer registers results in the electrical circuit 405 starting to calculate the two subsequent states of the butterfly structure 300, that is to say starts to calculate the first subsequent state and the second subsequent state, and to calculate the current zero paths and one's paths. During this period, the input state registers 101, 103 are loaded with the new values for the next butterfly, that is to say they are preloaded.

After initialization and the first butterfly, the sequence for the subsequent butterflies, which are executed iteratively, within a time period μ is identical, and is executed for all the states to be considered within the trellis, in accordance with the Viterbi algorithm:

The state metric of the respective initial state $s_{\mu-1,i}$ is loaded into the first initial state register 101. The state metric of the second initial state $s_{\mu-1,i+1}$ is loaded into the second initial state register 103.

A value is then loaded into the second transition register 113, with this value being obtained in accordance with the following rule:

$$d_{i+2}-d_i=d_{i+3}-d_{i+1}. \quad (17)$$

If it is certain that the values determined by the adder/subtracter network 117 and the corresponding multiplexers, comparison units and/or the trace-back register and the maximum selection units are stable, then the results (which are stored by the computation steps in the final state register) for the subsequent states, that is to say for the final states $s_{\mu,j}$ and $$s_{\mu,j+\frac{N}{2}},$$

are read from the first final state register 182 and from the second final state register 186 via the signal bus 402, with the calculation of the values for the next butterfly being started at the same time that the second final state register 186 is read, as has been described above.

It should be noted that the trace-back register 159 is not required in the course of the equalization process, that is to say only elements of the first maximum selection unit 153 can be stored via the first multiplexer 150 in the fourth final state register 198.

Once the final butterfly has been determined for the trellis for the respective time period, then the best zero path or one's path are then read from the third final state register 190 and the fourth final state register 190.

During channel decoding a channel-coded code word using a binary symbol alphabet, the butterfly 310 illustrated in FIG. 3b is applicable, with the branch metric d in each case representing the sum of reliability values, supplied from the equalizer, the number of which results from the convolution code rate.

As has been described above, the reliability values are assigned a mathematical sign, before being added up, with the sign being obtained from the trellis state and the polynomial of the convolution code.

It should be noted that the electrical circuit 405 provides a maximum likelihood sequence estimation (MLSE), that is to say the complete reception sequence of the electrical signals is first of all processed in the trellis diagram, with the respective selected final states being stored in the trace-back register, and the output of the estimate d statistically optimum signal sequence then being determined by means of so-called back-tracing.

The electrical circuit 405 calculates the final states in accordance with the butterfly shown in FIG. 3b, and also stores the corresponding selection decisions in the respective time period μ for back-tracing.

In the course of channel decoding, the electrical circuit 405 is initialized in the following way, and a first butterfly is executed in the following way:

The second transition register 113 is preloaded with the value 0.

In a further step, the state metric of the first initial state is loaded into the first initial state register 101. Furthermore, the second initial state, that is to say the state metric of the second initial state, is loaded into the second initial state register 103.

In addition, the transition metric is loaded in the first transition register 111.

The second final state register 188 is read, and results in initiation of the loading of those values which have been loaded in the first initial state register 101 and in the second initial state register 103 into the corresponding buffer registers, that is to say into the first buffer register 105 and into the second buffer register 108. This starts the calculations of the butterflies.

While the electrical circuit 405 is calculating the final states, the state metrics for the next butterfly can be written to the first initial state register 101 and to the second initial state register 103.

The following procedure is accordingly adopted for further iterations of the subsequent butterflies:

The state metric of the respective first initial state $s_{\mu-1,i}$ is loaded into the first initial state register 101. Furthermore, the state metric of the second initial state $s_{\mu-1,i+1}$ is loaded into the second initial state register 103.

If it is certain that the data stored in the registers are stable, then the final states are read from the final state registers, that is to say in particular from the first final state register 182 and from the second final state register 186, as a result of which, as has been described above, the calculation of the next iteration for the next butterfly is started immediately.

For each final state, the selection decision is written to the fourth final state register 196 in the form of a bit. Thus, the trace-back register, which has a length of 3 bits, must be read at the latest after eight butterflies, assuming the fourth final state register 198 has a length of 8 bits.

The fourth final state register 196 is likewise updated when the second final state register 198 is read.

The following documents are cited in this document:

[1] WO 99/34520
[2] W. Koch and A. Baier, Optimum and Suboptimum Detection of Coded Data Disturbed by Time-Varying Intersymbol Interference, IEEE GLOBECOM, pages 1679–1684, 1999
[3] G. D. Forney, The Viterbi-Algorithm, Proceedings of the IEEE, Vol., 61, No. 3, pages 268–278, 1973.

The invention claimed is:

1. An apparatus for executing a Viterbi algorithm, comprising:
   initial state registers each storing a state metric of an initial state of a trellis having a butterfly structure, a state metric, and a transition metric;
   at least one transition register storing the transition metric of the trellis;
   evaluation units;
   an adder/subtracter network for processing signals, said adder/subtracter network connected:
      to said initial state registers;
      to said at least one transition register; and
      to said evaluation units in accordance with the butterfly structure of the trellis;
   said evaluation units evaluating signals processed by said adder/subtracter network in accordance with a Viterbi algorithm;
   a selection unit switching the apparatus between a first operating mode and a second operating mode, wherein the first operating mode is in a different field of operation than the second operating mode;

final state registers connected to said evaluation units, each of said final state registers storing the state metric of a respective final state of the trellis; and said selection unit selecting different ones of said evaluation units in dependence upon a selected one of said first and second operating modes.

2. The apparatus according to claim 1, wherein at least one of said initial state registers has a buffer register.

3. The apparatus according to claim 1, wherein said at least one transition register at least one of:
   stores a transition metric when said selection unit switches the apparatus to said first operating mode; and
   stores a change transition metric when said selection unit switches the apparatus to said second operating mode.

4. The apparatus according to claim 1, wherein said at least one transition register:
   stores a transition metric when said selection unit switches the apparatus to said first operating mode; and
   stores a change transition metric when said selection unit switches the apparatus to said second operating mode.

5. The apparatus according to claim 1, wherein said at least one transition register is at least two transition registers storing two different transition metrics when said selection unit switches the apparatus to said second operating mode.

6. The apparatus according to claim 1, including:
   a signal bus connected to said initial state registers, said at least one transition register, and said final state registers; and
   a processor connected to said initial state registers, said at least one transition register, and said final state registers through said signal bus.

7. The apparatus according to claim 6, wherein said processor is programmed to calculate the state metric and the transition metric.

8. The apparatus according to claim 6, including a memory connected to said initial state registers, said at least one transition register, and said final state registers through said signal bus, said memory storing the state metric and the transition metric.

9. The apparatus according to claim 1, including:
   a signal bus connected to said initial state registers, said at least one transition register, and said final state registers; and
   a memory connected to said initial state registers, said at least one transition register, and said final state registers through said signal bus, said memory storing the state metric and the transition metric.

10. The apparatus according to claim 1, wherein said adder/subtracter network includes at least one of:
   an adder; and
   a subtracter.

11. The apparatus according to claim 1, wherein:
   said at least one of said initial state registers includes a first initial state register and a second initial state register;
   said first initial state register has a first buffer register with a first buffer register output;
   said second initial state register has a second buffer register with a second buffer register output;
   said adder/subtracter network includes three adders and three subtracters;
   each of said three adders and said three subtracters has a first input, a second input, and an output;
   said at least one transition register includes a first transition register, a second transition register, and a third transition register;

said first transition register has a first transition register output;
said second transition register has a second transition register output;
said third transition register has a third transition register output;
said first input of said first adder is connected to said first transition register output;
said second input of said first adder is connected to said second transition register output;
said first input of said first subtracter is connected to said second transition register output;
said second input of said first subtracter is connected to said third transition register output;
said first input of said second adder is connected to said first buffer register output;
said second input of said second adder is connected to said output of said first adder;
said first input of said second subtracter is connected to said first buffer register output;
said second input of said second subtracter is connected to said output of said first adder;
said first input of said third adder is connected to said output of said first subtracter;
said second input of said third adder is connected to said second buffer register output;
said first input of said third subtracter is connected to said output of said first subtracter; and
said second input of said third subtracter is connected to said second buffer register output.

12. The apparatus according to claim 11, wherein said evaluation units include at least one of:
   a trace-back register;
   comparison units including:
      a first comparator with a first comparator output, a first input, and a second input; and
      a second comparator with a second comparator output, a first input, and a second input;
   maximum selection elements;
   said first input of said first comparator is connected to said output of said second adder;
   said second input of said first comparator is connected to said output of said third subtracter;
   said first input of said second comparator is connected to said output of said second subtracter; and
   said second input of said second comparator is connected to said output of said third adder.

13. The apparatus according to claim 12, wherein:
   said maximum selection elements include:
      a first maximum selection element having a control input, a first input, and a second input;
      a second maximum selection element having a control input, a first input, and a second input;
   said final state registers include a second final state register with a control output;
   said control input of said first maximum selection element is connected to said control output of said first final state register such that, when a value is read from said first final state register, said first maximum selection element can select a new value;
   said first input of said first maximum selection element is connected to said output of said second adder;
   said second input of the first maximum selection element is connected to said output of said second subtracter;
   said control input of said second maximum selection element is connected to said control output of said second final state register such that, when a value is read from said second final state register, said second maximum selection element can select a new value;
said first input of said second maximum selection element is connected to said output of said third subtracter; and
said second input of said second maximum selection element is connected to said output of said third adder.

14. The apparatus according to claim 11, wherein:
said trace-back register has a control input, a first data input, and a second data input;
said final state registers include a first final state register with a control output;
said control input of said trace-back register is connected to said control output of said first final state register such that, when a value is read from said first final state register, said trace-back register can store new values;
comparison units including:
a first comparator with a first comparator output, a first input, and a second input; and
a second comparator with a second comparator output, a first input, and a second input;
said first comparator output is connected to said first data input of said trace-back register;
said second comparator output is connected to said second data input of the trace-back register;
said first input of said first comparator is connected to said output of said second adder;
said second input of said first comparator is connected to said output of said third subtracter;
said first input of said second comparator is connected to said output of said second subtracter; and said second input of said second comparator is connected to said output of said third adder.

15. The apparatus according to claim 14, wherein:
said maximum selection elements include;
a first maximum selection element having a control input, a first input, and a second input;
a second maximum selection element having a control input, a first input, and a second input;
said final state register include a second final state register with a control output;
said control input of said first maximum selection element is connected to said control output of said first final state register such that, when a value is read from said first final state register, said first maximum selection element can select a new value;
said first input of said first maximum selection element is connected to said output of said second adder;
said second input of the first maximum selection element is connected to said output of said second subtracter;
said control input of said second maximum selection element is connected to said control output of said second final state register such that, when a value is read from said second final state register, said second maximum selection element can select a new value;
said first input of said second maximum selection element is connected to said output of said third subtracter; and
said second input of said second maximum selection element is connected to said output of said third added.

16. The apparatus according to claim 11, wherein said selection unit includes a selection register and at least one multiplexer is connected to said selection unit.

17. The apparatus according to claim 16, wherein:
a signal bus is connected to said initial state registers, said at least one transition register, and said final state registers;
said at least one multiplexer includes:
a first multiplexer having:
a control input;
a first data input; and
a second data input;
a second multiplexer having:
a control input;
a first data input; and
a second data input;
a third multiplexer having:
a control input;
a first data input; and
a second data input;
said evaluation units include:
a trace-back register with a first data output, a first data input, and a second data output;
comparison units; and
maximum selection elements including a first maximum selection element with an output;
said selection register has an input connected to said signal bus and an output connected to said control input of said first multiplexer;
said first data input of said first multiplexer is connected to said first data output of said trace-back register;
said second data input of said first multiplexer is connected to said output of said first maximum selection element;
said control input of said second multiplexer is connected to said first data input of said trace-back register;
said first data input of said second multiplexer is connected to said output of said second adder;
said second data input of said second multiplexer is connected to said output of said third subtracter;
said comparison units include:
a first comparator; and
a second comparator with a second comparator output
said control input of said third multiplexer is connected to said second comparator output;
said first data input of said third multiplexer is connected to said output of said second subtracter; and
said second data input of said third multiplexer is connected to said output of said third adder.

18. The apparatus according to claim 1, wherein said evaluation units include at least one of:
a trace-back register;
comparison units; and
maximum selection elements.

19. The apparatus according to claim 18, wherein:
said trace-back register has a control input, a first data input, and a second data input;
said final state registers include a first final state register with a control output;
said control input of said trace-back register is connected to said control output of said first final state register such that, when a value is read from said first final state register, said trace-back register can store new values;
said comparison units include:
a first comparator with a first comparator output; and
a second comparator with a second comparator output;
said first comparator output is connected to said first data input of said trace-back register, and
said second comparator output is connected to said second data input of the trace-back register.

20. The apparatus according to claim 1, wherein said selection unit includes a selection register and at least one multiplexer is connected to said selection unit.

21. The apparatus according to claim 1, wherein said first operating mode is a mode in which decoding is carried out in accordance with the Viterbi algorithm.

22. The apparatus according to claim 1, wherein said second operating mode is a mode in which equalization is carried out in accordance with the Viterbi algorithm.

23. A method for executing a Viterbi algorithm, which comprises:
    selecting one of a first operating mode and a second operating mode of an apparatus to execute the Viterbi algorithm, wherein the first operating mode is in a different field of operation than the second operation mode;
    respectively storing a state metric of an initial state of a trellis in an initial state register;
    storing at least one transition metric of the trellis dependent upon on the selected one of the operating modes;
    linking the state metrics of the initial states and the transition metric to one another according to a butterfly structure of the trellis using the Viterbi algorithm dependent upon the selected one of the operating modes;
    selecting linked variables dependent upon the selected one of the operating modes;
    storing the selected linked variables as state metrics of a respective final state of the trellis; and
    iteratively carrying out the preceding steps of the method until the Viterbi algorithm ends.

24. The method according to claim 23, which further comprises using the Viterbi algorithm to process physical signal.

25. The method according to claim 23, which further comprises using the Viterbi algorithm to equalize and decode received.
    physical signal dependent upon the selected one of the operating modes.

26. The method according to claim 23, which further comprises using the Viterbi algorithm to decode received physical signal in a first of the operating modes and to equalize the received physical signals in a second of the operating modes.

27. The method according to claim 23, which further comprises:
    decoding physical signals in a first of the operating modes; and
    equalizing the physical signal in a second of the operating modes.

28. The method according to claim 23, which further comprises:
    storing a respective state metric, which is stored in the initial state register, of the initial state of the trellis in a respective buffer register as soon as a final state has been read from a final state register; and
    storing a new state metric of the initial state of the trellis in a respective initial state register as soon as the respective initial state of the trellis has been stored in the buffer register.

* * * * *

UNITED STATES PATENT AND TRADEMARK OFFICE
CERTIFICATE OF CORRECTION

PATENT NO. : 7,127,666 B2 Page 1 of 1
APPLICATION NO. : 09/864980
DATED : October 24, 2006
INVENTOR(S) : Peter Aymar et al.

It is certified that error appears in the above-identified patent and that said Letters Patent is hereby corrected as shown below:

Column 1,

Line 25, "167-1684" should read -- 1679-1684 --

Line 50, "different;" should read -- different, --

Column 17,

Line 35, "include;" should read -- include: --

Column 19,

Line 31, "signal." should read -- signals. --

Column 20,

Line 4, "signal" should read -- signals --

Signed and Sealed this

Third Day of April, 2007

JON W. DUDAS
*Director of the United States Patent and Trademark Office*